(12) United States Patent
Fukuta et al.

(10) Patent No.: US 7,004,984 B2
(45) Date of Patent: Feb. 28, 2006

(54) METHOD OF PRODUCING CERAMIC MULTILAYER SUBSTRATE

(75) Inventors: Junzo Fukuta, Nagoya (JP); Satoru Adachi, Nagoya (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/753,535

(22) Filed: Jan. 9, 2004

(65) Prior Publication Data

US 2004/0144476 A1    Jul. 29, 2004

(30) Foreign Application Priority Data

Jan. 9, 2003   (JP) .............................. 2003-002704

(51) Int. Cl.
*H01M 6/00*   (2006.01)
*B32B 31/14*  (2006.01)

(52) U.S. Cl. ................... 29/623.3; 29/830; 29/831; 29/832; 29/850; 29/851; 156/79

(58) Field of Classification Search .............. 29/623.3, 29/830, 831, 832, 850, 851; 156/79, 89.11; 174/68.5, 257; 361/411, 414; 501/73, 77
See application file for complete search history.

(56) References Cited

U.S. PATENT DOCUMENTS 4,490,429 A * 12/1984 Tosaki et al. ............ 428/195.1
4,650,923 A *  3/1987 Nishigaki et al. ........... 174/257
4,791,239 A * 12/1988 Shirahata et al. ........... 174/258
4,795,670 A *  1/1989 Nishigaki et al. ........... 428/209
4,806,334 A *  2/1989 Fujinaka et al. ............. 428/631
4,882,650 A * 11/1989 Maher et al. ............. 361/321.4

FOREIGN PATENT DOCUMENTS

JP       01-295483      11/1989
JP       09-092983       4/1997

\* cited by examiner

*Primary Examiner*—A. Dexter Tugbang
*Assistant Examiner*—Tai Nguyen
(74) *Attorney, Agent, or Firm*—Dickstein, Shapiro, Morin & Oshinsky, LLP.

(57) ABSTRACT

After a resistor and/or a capacitor are simultaneously fired on a fired ceramic core substrate to be fired, the fired resistor and/or the fired capacitor is trimmed so that the resistance and the capacitance are adjusted. Thereafter, an after-lamination green sheet is laminated onto the ceramic core substrate and the produced after-lamination substrate is fired at a temperature which is lower than the sintering temperature of the resistor and the dielectric. Thus, the sintered resistor and dielectric can be prevented from being softened and melted when the after-lamination substrate is fired. Moreover, the resistance and the capacitance accurately adjusted by trimming before the after-lamination substrate is fired are not changed by the firing.

20 Claims, 4 Drawing Sheets

METHOD OF PRODUCING CERAMIC MULTILAYER SUBSTRATE

BACKGROUND OF THE INVENTION

1. Field of the Invention

The present invention relates to a method of producing a ceramic multi-layer substrate containing a resistor and/or a dielectric.

2. Description of the Related Art

In production of ceramic multi-layer substrates containing resistors and capacitors by a green sheet lamination method, problems occur. The ceramic materials for the substrates and those for the resistors and the dielectrics, the compositions are different, and the firing shrinking characteristics are also different. Thus, when the materials for the substrate, the resistor and/or the dielectric are laminated and simultaneously fired, the substrate tends to be deflected, cracked or distorted, which are caused by the different firing shrinking characteristics.

To solve the above-described problems, the following technique has been developed, as described, e.g., in Japanese Unexamined Patent Application Publication No. 9-92983 (Patent Document 1) p.2 to p.3. That is, to a ceramic green sheet having a resistor and capacitor (dielectrics and electrodes) printed and fired at a low temperature, another ceramic green sheet is laminated. Thus, a green substrate containing the resistor and the capacitor is formed. Then, dummy green sheets (alumina green sheets) which can not be sintered at the sintering temperature of the substrate are laminated to both of the sides of the green substrate. The green sheets and the green substrate are simultaneously fired at about 900° C. while they are pressed from the upper side thereof. Thereafter, the non-sintered dummy green sheets adhering to both of the sides of the fired substrate are removed, and thus, a capicator and resistor containing (CR) ceramic multilayer substrate is produced.

However, it is impossible according to this production method to adjust the resistance or capacitance for the resistor or capacitor contained in the multi-layer substrate by trimming after the green substrate is fired. Thus, the multi-layer substrate has problems in that the resistance or capacitance has a large dispersion.

As described, e.g., in Japanese Unexamined Patent Application Publication No. 1-295483, (Patent Document 2) p.2 to p.3, it has been suggested that a resistor be trimmed to adjust the resistance before a green sheet having the resistor printed thereon is laminated, and thereafter, the green sheet is laminated and fired.

Even if the resistor is trimmed for adjustment of the resistance before the lamination of the green sheet (i.e., before the firing), as described in Patent Document 2, it is difficult to control the amount of an glass component which permeates from the green sheet into the resistor during the subsequent firing, so that the resistance of the resistor is varied as a consequence of the different amounts of the glass component permeated into the resistor at firing. Moreover, when the ceramic and the resistor or the dielectric having different firing shrinking characteristics are laminated and simultaneously fired, bubbles are readily formed inside the resistor or the dielectric. The formation of bubbles also causes the dispersion of the resistance or the capacitance to be increased.

It has been proposed that a cavity (hole) is formed in a ceramic multi-layer substrate, so that a contained resistor is exposed at the bottom of the cavity, and can be trimmed for adjustment of the resistance after the substrate is fired.

However, ceramic multi-layer substrates of which the wiring densities are high and the sizes are small have been used in recent years. From the standpoints of the small spaces, the ceramic multilayer substrates can scarcely afford to have cavities which are formed for trimming of the contained resistors, respectively. Thus, it may not be feasible to form such cavities in many cases. Even if a fine cavity is formed in a small-sized ceramic multilayer substrate, a contained resistor can be accurately trimmed through the fine cavity only with much difficulty.

SUMMARY OF THE INVENTION

In view of the forgoing, the present invention has been devised. It is an object of the present invention to provide a method of producing a ceramic multilayer substrate containing a resistor and/or a capacitor of which the electrical characteristics are less dispersed, and the qualities are high.

According to the present invention, there is provided a method of producing a ceramic multilayer substrate containing a resistor and/or a capacitor which includes the steps of: firing the resistor and/or the dielectric and electrodes of the capacitor provided on an unfired ceramic core substrate simultaneously with the unfired ceramic core substrate, or afterfiring the resistor and/or the dielectric and electrodes of the capacitor provided on a fired ceramic core substrate; trimming the fired resistor and/or the fired capacitor so that the resistance and/or the capacitance is adjusted; laminating at least one unfired ceramic green sheet (hereinafter, referred to as an after-lamination green sheet) capable of being sintered at a lower temperature than the sintering temperature of the resistor and/or the dielectric of the capacitor onto the surface of the fired ceramic core substrate to produce an after-lamination substrate; and firing the after-lamination substrate at a temperature which is lower than the sintering temperature of the resistor and/or the dielectric of the capacitor.

In this case, needless to say, in addition to the resistor and the capacitor, a wiring pattern or the like may be printed on the surface of the ceramic core substrate to be fired. Moreover, needless to say, before the lamination step, a wiring pattern, a via-conductor, and so forth may be printed on the after-lamination green sheet.

According to the method of producing a ceramic multilayer substrate of the present invention, after the resistor and the capacitor are fired simultaneously with the ceramic core substrate, or the resistor and the dielectric and electrodes of the capacitor are printed on the fired ceramic core substrate to be fired, the resistor and the capacitor are trimmed so that the resistance and the capacitance are adjusted. Thus, the resistance and the capacitance can be adjusted with high precision by trimming before the lamination. Thereafter, at least one after-lamination green sheet is laminated onto the surface of the ceramic core substrate. Thus, the after-lamination substrate is formed. The after-lamination substrate is fired at a temperature lower than the sintering temperature of the resistor and the dielectric. Thus, the sintered resistor and dielectric can be prevented from being softened and melted when the after-lamination substrate is fired. Moreover, the sintering states of the resistor and the dielectric can be prevented from being changed. The resistance and the capacitance accurately adjusted by trimming before the after-lamination substrate is fired (before the after-lamination green sheet is laminated) can be kept as they are, and not be changed by the firing. Thus, the ceramic multilayer substrate containing the resistor and the capacitor is a high quality one, and has less variations of the resistance and the capacitance.

Preferably, the firing temperature of the after-lamination substrate is set at a temperature which is lower than the glass yield point of a glass component contained in the resistor and/or the dielectric of the capacitor. Thereby, the sintered resistor and dielectric can be securely prevented from being softened and melted when the after-lamination substrate is fired. Thus, the dispersions of the resistance and the capacitance, which may be caused by the firing, can be securely reduced.

Also, preferably, the after-lamination green sheet is made from a $SiO_2$—$Al_2O_3$—$CaO$—$B_2O_3$—$Li_2O$ type glass. The $SiO_2$—$Al_2O_3$—$CaO$—$B_2O_3$—$Li_2O$ type glass has a glass yield point of 620° C. Thus, the after-lamination substrate can be fired at a lower temperature (e.g., 700° C.) compared to the glass yielding points of the resistor and the dielectric which contain a different glass. The variation of the resistance and the capacitance, which may be caused by firing, can thereby be securely reduced.

Also, preferably, the ceramic core substrate is made from a low-temperature firing ceramic which is fired at a temperature of about 800° C. to 1000° C. Thereby, advantageously, the ceramic core substrate, the resistor and the capacitor can be simultaneously fired. The number of firing processes can be reduced. In addition, as a wiring conductor which is fired simultaneously with the ceramic core substrate, metals with low melting points such as Ag type conductors having a low resistance and superior electrical characteristics can be employed. Needless to say, the resistor and the dielectric and electrodes of the capacitor may be printed on the fired ceramic core substrate and then fired in the case in which the ceramic core substrate is made from a low temperature firing ceramic.

When the after-lamination substrate is fired, the firing-shrinking of the after-lamination green sheet, laminated onto the fired ceramic core substrate, is suppressed on the one side of the green sheet, due to the fired ceramic core substrate. If the firing shrinking force of the after-lamination green sheet is rather small compared to the mechanical strength of the ceramic core substrate, no problems will occur. However, if the mechanical strength of the ceramic core substrate is low, or the number of the after-lamination green sheets laminated onto the ceramic core substrate is increased to have a large firing shrinking force, the ceramic core substrate may be not durable to the firing shrinking force. As a result, the fired substrate will be distorted.

As a countermeasure against the above-described problems, the ceramic core substrate may be formed to have a multilayer structure. Thus, the mechanical strength of the ceramic core substrate can be enhanced so that the distortion of the fired substrate is eliminated with the wiring-density of the ceramic core substrate being enhanced and also with the size being reduced.

Moreover, preferably, a constraining green sheet incapable of being sintered at the sintering temperature of the after-lamination green sheet is laminated onto the after-lamination green sheet laminated as the outermost layer of the after-lamination substrate. In the subsequent firing step, the after-lamination green sheet is constrainingly fired at the sintering temperature thereof with the after-lamination substrate being pressed via the constraining green sheet or not, so that the after-lamination substrate is integrated, and the remaining constraining-green sheet is removed. Accordingly, the firing shrinkage or distortion in the X and Y directions of the after-lamination green sheet laminated onto the fired ceramic core substrate can be suppressed substantially uniformly on both of the sides of the after-lamination green sheet. A high-quality ceramic multilayer substrate having no distortion can be produced.

DESCRIPTION OF THE PREFERRED EMBODIMENTS

Figure 1:
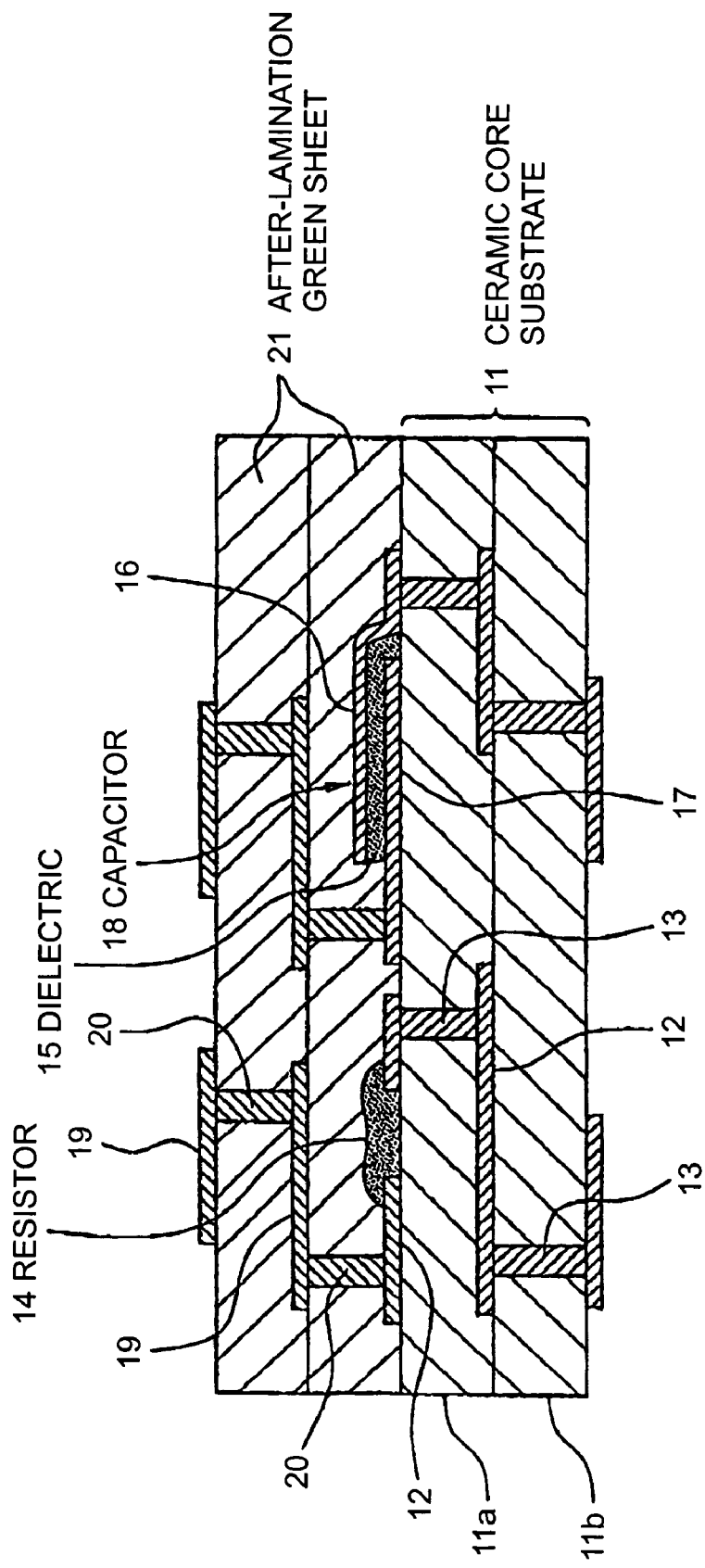
FIG. 1 is a schematic longitudinal cross-sectional view showing the structure of a CR contained ceramic multilayer substrate produced by the method according to an embodiment of the present invention.

Hereinafter, a method of making a CR ceramic multilayer substrate of the present invention will be described with reference to the drawings.

First, the structure of a CR ceramic multilayer substrate produced by the method of this embodiment will be described with reference to FIG. 1.

The CR ceramic multilayer substrate is formed by laminating at least one low-temperature firing ceramic green sheet (hereinafter, referred to as an after-lamination green sheet) 21 on a fired ceramic core substrate 11 to form a laminate (hereinafter, referred to as an after-lamination substrate), and firing the after-lamination substrate.

The ceramic core substrate 11 may be a single-layer substrate made from one ceramic green sheet or from multiple layers. In this embodiment, the ceramic core substrate 11 comprises at least two-layers, i.e., multilayer substrate which is suitable for high-density wiring, enhancement of the strength, and so forth. As the material of the ceramic core substrate 11, different ceramic materials can be employed, such as high-temperature sintering ceramics such as alumina or the like, low-temperature firing ceramics capable of being fired at a temperature of about 800° C. to 1000° C., piezoelectric ceramics, magnetic ceramics, and so forth can be employed. In this embodiment, a low-temperature sintering ceramic material capable of being fired at a temperature of about 800° C. to 1000° C. is used. As the low-temperature sintering ceramic material, for example, a mixture of about 50–85% by weight (preferably about 55–60% by weight) of $SiO_2$—$Al_2O_3$—$CaO$—$B_2O_3$ type glass and about 35–50% by weight (preferably about 40–45% by weight) of $Al_2O_3$ is preferable. In addition, low-temperature ceramic materials capable of being fired at a temperature of about 800 to 1000° C. such as a mixture of $SiO_2$—$B_2O_3$ type glass and $Al_2O_3$, a mixture of a $PbO$—$SiO_2$—$B_2O_2$ type glass and alumina, cordierite type crystallized glass, and so forth may be employed.

Wiring patterns 12 and via-conductors 13 for inter-layer connection are formed in ceramic layers 11a and 11b constituting the ceramic core substrate 11. A resistor 14, a dielectric 15, and electrodes 16 and 17 are printed and fired, in addition to the wiring pattern 12, on the upper surface of the ceramic core substrate 11.

The resistor 14 is made from a resistor material which can be simultaneously-fired or after-fired with the ceramic core substrate 11, such as a mixture of conductive powder of $RuO_2$, $RuBi_2O_5$ or the like, and glass powder. The glass powder compounded for the resistor 14 may be the same type as that of the low-temperature firing ceramic material to form the ceramic core substrate 11 (e.g., a $SiO_2$—$Al_2O_3$—$CaO$—$B_2O_3$ type glass, $SiO_2$—$B_2O_3$ type glass, or the like). The compounding ratio of the conductive powder such as a $RuO_2$ power or the like and the glass powder may be adjusted correspondingly to a required sheet-resistance. In general, the higher the compounding ratio of the conductive powder is, the smaller the sheet resistance.

Electrodes 16 and 17 are formed on the upper and lower sides of the dielectric 15 to form a capacitor 18. The dielectric 15 may be made from a dielectric material which can be simultaneously-fired or after-fired with the ceramic core substrate 11. In the case in which a capacitor having a relatively small capacitance is formed, the dielectric 15 may be made from the same type of low-temperature firing ceramic material (e.g., a mixture of glass powder and alumina powder) as that for the ceramic core substrate 11. In the case in which a capacitor having a large capacitance is used, the dielectric 15 may be made from a mixture of powder of a material having a high dielectric constant (e.g., $BaTiO_3$ or the like) and glass powder.

The adjustment of the resistance of the resistor 14 and the capacitance of the capacitor 18 is carried out by laser-trimming before the after-lamination green sheet 21 is laminated to the fired ceramic core substrate 11.

The after-lamination green sheet 21, laminated to the fired ceramic core substrate 11, is made from a low-temperature firing ceramic material which can be sintered below the sintering temperature of the resistor 14 or the dielectric 15, and preferably, at a temperature lower than the glass yield point of the glass component contained in the resistor 14 or the dielectric 15. Each after-lamination green sheet 21 has a wiring pattern 19 and via-conductors 20 formed therein, as necessary for connection to other conductors. It is to be noted that a resistor and a capacitor dielectric may be formed on the upper surface of the uppermost after-lamination green sheet 21 by simultaneous firing or after-firing, if necessary, and the resistance and the capacitance are adjusted by trimming after the firing.

Figure 2:
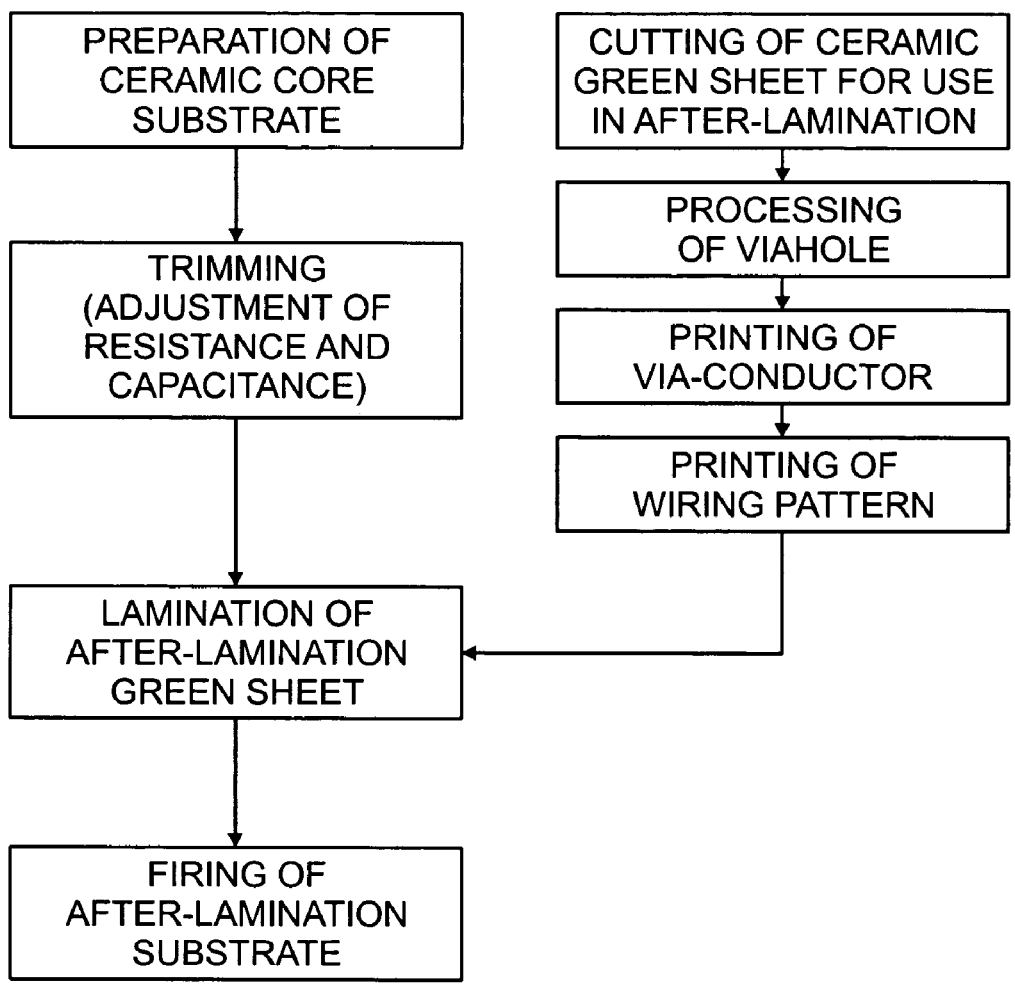
FIG. 2 is a flow-chart showing processes of producing the CR contained ceramic multilayer substrate.

Hereinafter, a method of producing the CR ceramic multilayer substrate will be described with reference to FIGS. 2 to 4. The ceramic core substrate 11 having the resistor 14 and the capacitor 18 is produced by a simultaneous-sintering method illustrated in FIG. 3 or by an after-firing method illustrated in FIG. 4.

Process of Producing Ceramic Core Substrate 11 (Simultaneous Firing Method)

Figure 3:
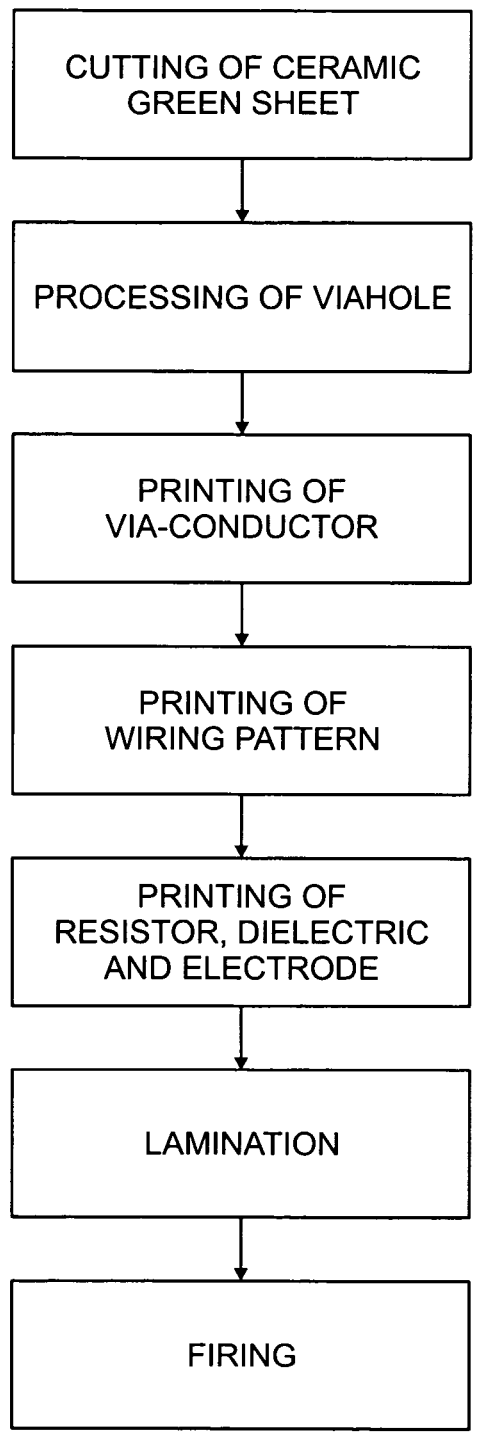
FIG. 3 is a flow chart showing processes of simultaneously firing a ceramic core substrate, a resistor and a capacitor.

For production of the ceramic core substrate 11, the resistor 14 and the capacitor 18 by a simultaneous-firing method, as illustrated in FIG. 3, a low-temperature firing ceramic green sheet is cut in a predetermined substrate-size, and the formed ceramic green sheets 11a and 11b are punched or the like so that viaholes are formed at predetermined positions in the ceramic green sheets 11a and 11b, respectively. Thereafter, printing is carried out so as to fill the viaholes of the ceramic green sheets 11a and 11b by use of paste containing a metal with a low melting point capable of being simultaneously fired with the ceramic green sheets 11a and 11b, such as Ag type conductor paste (e.g., Ag, Ag-Pd, Ag-Pt, Ag-Pd-Pt, or the like), Au type conductor paste or Cu type conductor paste. Thereafter, wiring patterns 12 are printed on the ceramic green sheets 11a and 11b by use of the same type of conductor paste as described above.

A lower-side electrode 17 of the capacitor 18 is printed simultaneously with the printing of the wiring pattern 12 on the ceramic green sheet 11a as the uppermost layer. Thereafter, the dielectric 15 of the capacitor 18 is printed on the lower-side electrode 17 by use of a dielectric paste capable of being simultaneously fired with the ceramic green sheets 11a and 11b (e.g., paste containing a mixture of glass powder and alumina powder, or paste containing a mixture of $BaTiO_3$ powder and glass powder). Thereafter, an upper-side electrode 16 is printed on the dielectric 15 by use of the above-described conductor paste.

A resistor 14 is printed on the ceramic green sheet 11a as the uppermost layer by use of a resistor paste capable of being fired simultaneously with the ceramic green sheets 11a and 11b (e.g., a paste containing a mixture of $RuO_2$ powder and glass powder). The printing process of the resistor 14 may be carried out before or after the dielectric 15 and the upper-side electrode 16 are printed.

After all the printing processes are completed, the ceramic green sheets 11a and 11b are laminated, and fired at a temperature of about 800° C. to 1000° C. Thus, the ceramic core substrate 11, the via-conductors 13, the wiring patterns 12, the resistor 14 and the capacitor 18 are simultaneously fired.

Figure 4:
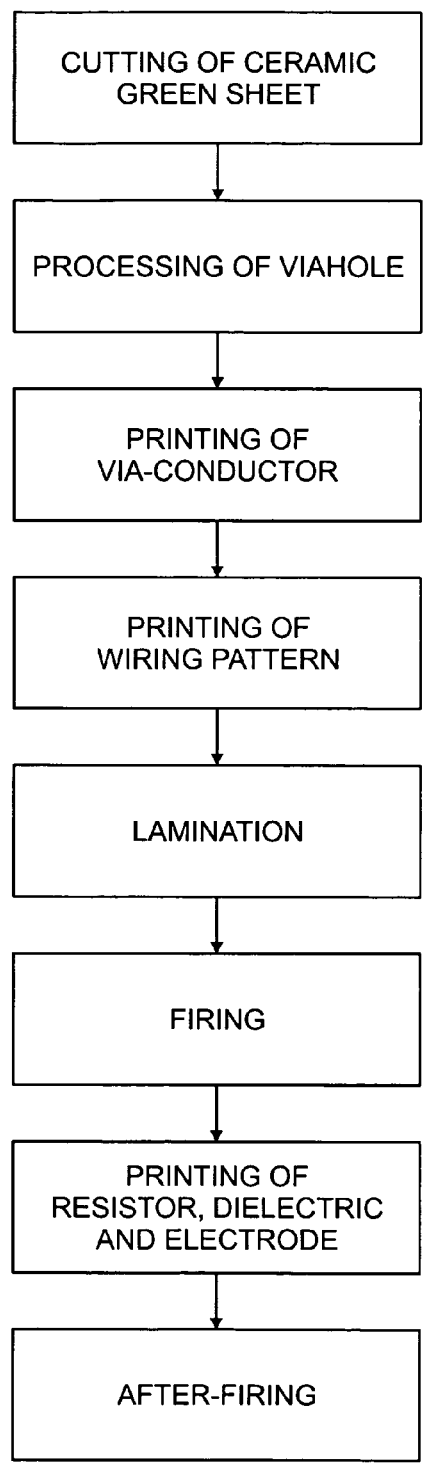
FIG. 4 is a flow chart showing processes of simultaneously firing a resistor and a capacitor on a fired ceramic core substrate.

Production Process for Ceramic Core Substrate (After-Firing Method) In the case in which the resistor 14 and the capacitor 18 are formed by after-firing on the fired ceramic core substrate 11, as illustrated in FIG. 4, the ceramic core substrate 11 is fired at a temperature of about 800° C. to 1000° C. without printing of the resistor 14, the dielectric 15, and the upper-side electrode 16. Thereafter, the resistor 14 and the dielectric 15 are printed, and then the upper-side electrode 16 is printed on the dielectric 15. Thereafter, the resistor 14, the dielectric 15 and the upper-side electrodes 16 are fired at a temperature which is equal to or is slightly lower than the firing temperature of the ceramic core substrate 11.

In this case, the wiring pattern 12 and the lower-side electrode 17 may be printed on the lower surface of the substrate 11 before the ceramic core substrate 11 is fired, so as to be fired simultaneously with the ceramic core substrate 11. Alternatively, the wiring pattern 12 and the lower-side electrode 17 are printed on the upper surface of the ceramic core substrate 11 after the ceramic core substrate 11 is fired. Thereafter, the resistor 14, the dielectric 15 and the upper-side electrode 16 are printed. Then, the wiring pattern 12, the lower-side electrode 17, the resistor 14, the dielectric 15, and the upper-side electrode 16 are fired at the same time.

Trimming Process

A trimming process is carried out after the ceramic core substrate 11, the resistor 14 and the capacitor 18 are fired according to the method of FIG. 3 or FIG. 4. In this process, the resistance of the fired resistor 14 and the capacitance of the capacitor 18 are adjusted. For example, a part of the resistor 14 is groove shape scraped by trimming techniques such as laser-trimming, sand-blasting, discharge-processing or the like, in which the length or width of the groove (the area of the groove) is adjusted. Thus, the resistance of the resistor 14 is adjusted. Moreover, a part of the upper-side electrode 16 of the capacitor 18 is scraped off by a trimming method similar to the above-described one so that the area of the upper-side electrode 16 is adjusted. Thus, the capacitance of the capacitor 18 is adjusted.

Laminating Process of After-Lamination Green Sheet 21

After the resistor 14 and the capacitor 18 are trimmed, at least one after-lamination green sheet 21 is laminated to the ceramic core substrate 11 to form an after-lamination substrate. In this embodiment, the after-lamination green sheet 21 is made from a low-temperature firing ceramic which is capable of being sintered below the sintering temperature of the resistor 14 and the capacitor 18. Preferably, the low-temperature firing ceramic which is capable of being sintered at a temperature lower than the glass yield point of a glass component contained in the resistor 14 and the dielectric 15 of the capacitor 18 (e.g., $SiO_2$—$Al_2O_3$—CaO—$B_2O_3$—$Li_2O$ type glass ceramic).

The after-lamination green sheet 21 is punched or the like in predetermined positions thereof to form viaholes in advance. Thereafter, the viaholes of the after-lamination green sheet 21 are filled by printing with a paste of a metal having a low melting point capable of being fired simultaneously with the after-lamination green sheet 21 (e.g., an Ag type conductor, an Au type conductor, and a Cu type conductor) to for via-conductors 20. Thereafter, the wiring patterns 19 are printed on the after-lamination green sheets 21 by use of the same type of conductor paste as described above. Then, at least one after-lamination green sheet 21 is laminated to the fired ceramic core substrate 11. Thus, an after-lamination substrate (CR-containing ceramic multi-layer substrate before firing) is formed.

Firing Process for CRCeramic Multilayer Substrate)

The after-lamination substrate, after it is formed, is fired. If the firing temperature of the after-lamination substrate is set at a higher temperature than the glass yield point of a glass component contained in the after-lamination substrate 21, the after-lamination substrate can be fired. In this embodiment, the firing temperature of the after-lamination substrate is set at a temperature which is lower compared to the sintering temperatures of the resistor 14 and the dielectric 15 (and preferably, a temperature which is lower compared to the glass yield points of glass components contained in the resistor 14 and in the dielectric 15) to prevent the resistance of the contained resistor 14 and the capacitance of the dielectric 15 from being changed when the after-lamination substrate is fired. Thus, the after-lamination substrate is fired to produce a CR ceramic multilayer substrate. If the firing temperature of the after-lamination substrate is set to be lower compared to the sintering temperatures of the resistor 14 and the dielectric 15, the sintered resistor 14 and the sintered dielectric 15 can be prevented from being softened or melted when the after-lamination substrate is fired. Thus, the sintering states of the resistor 14 and the dielectric 15 are prevented from being changed, and the precision of the resistance and that of the capacitance, accurately adjusted by trimming before the after-lamination substrate is fired (before the after-lamination green sheet 21 is laminated), can be maintained and is not changed by the firing of the after-lamination substrate. Thereby, a high-quality ceramic multilayer substrate containing the resistor 14 and the capacitor 18 of which the resistance and the capacitance are less varied is produced.

After the CR ceramic multilayer substrate is fired, a resistor and a dielectric (capacitor) may be after-fired on the surface of the CR-containing ceramic multilayer substrate, and the resistance and the capacitance trimmed so as to be adjusted, if desired.

EXAMPLE

The inventors produced CR ceramic multilayer substrates according to the production method of this embodiment under different conditions. The variation of the resistance of the contained resistors and that of the capacitance of the contained capacitors were measured. Table 1 shows the measurements.

TABLE 1

| | No. | Material for ceramic core substrate | Firing temperature for ceramic core substrate | Materials for contained resistor and capacitor | Firing condition for contained resistor and capacitor | Material for after-lamination green sheet | Firing temperature for after-lamination substrate | Dispersion of resistance of contained resistor | Dispersion of capacitance of contained capacitor |
|---|---|---|---|---|---|---|---|---|---|
| Example | 1 | A1 | 900° C. | R1 | Simultaneous firing | A3 | 700° C. | ±0.2% | — |
| | 2 | A1 | 900° C. | C1 | After-firing | A3 | 700° C. | — | ±0.1% |
| | 3 | A1 | 900° C. | R1, C1 | After-firing | A3 | 700° C. | ±0.3% | ±0.2% |
| | 4 | A2 | 900° C. | R2 | After-firing | A3 | 700° C. | ±0.3% | — |
| | 5 | A2 | 900° C. | C2 | Simultaneous firing | A3 | 700° C. | — | ±0.2% |
| Comparative | 6 | A1 | 900° C. | R1 | Simultaneous firing | A1 | 900° C. | ±22% | — |
| Example | 7 | A1 | 900° C. | C1 | After-firing | A1 | 900° C. | — | ±25% |

In Table 2, the compositions of materials A1 and A2 for the ceramic core substrate and a material A3 for the after-lamination green sheet are described in Table 2. The compositions of materials R1 and R2 for the contained resistor and those of materials C1 and C2 for the dielectric of the capacitor are described in Table 3.

TABLE 2

Compositions of ceramic core substrate and after-lamination green sheet

| | | Ceramic composition | | |
|---|---|---|---|---|
| Materials | Glass component | Glass yield point | Ceramic | Sintering Temperature |
| A1 | $SiO_2$—$Al_2O_3$—CaO—$B_2O_3$ type glass | 720° C. | $Al_2O_3$ | 900° C. |

TABLE 2-continued

Compositions of ceramic core substrate and after-lamination green sheet

Ceramic composition

| Materials | Glass component | Glass yield point | Ceramic | Sintering Temperature |
|---|---|---|---|---|
| A2 | $SiO_2$—$B_2O_3$ type glass | 730° C. | $Al_2O_3$ | 900° C. |
| A3 | $SiO_2$—$Al_2O_3$—CaO—$B_2O_3$—$Li_2O$ type glass | 620° C. | $Al_2O_3$ | 700° C. |

TABLE 3

Compositions of Resistor and Dielectric

Compositions of resistor and dielectric

|  | Material | Glass component | Glass yield point | Conductor or dielectric components |
|---|---|---|---|---|
| Resistor | R1 | $SiO_2$—$Al_2O_3$—CaO—$B_2O_3$ type glass | 720° C. | $RuO_2$ |
|  | R2 | $SiO_2$—$B_2O_3$ type glass | 730° C. | $RuO_2$ |
| Dielectric (capacitor) | C1 | $SiO_2$—$Al_2O_3$—CaO—$B_2O_3$ type glass | 720° C. | $Al_2O_3$ |
|  | C2 | $SiO_2$—$B_2O_3$ type glass | 730° C. | $BaTiO_3$ |

The material for the ceramic core substrate used in Examples 1 to 3 was a mixture of $SiO_2$—$Al_2O_3$—CaO—$B_2O_3$ type glass and $Al_2O_3$, represented by A1. The material for the resistor was a mixture of $SiO_2$—$Al_2O_3$—CaO—$B_2O_3$ type glass and $RuO_2$, represented by R1. The material for the dielectric is a mixture of $SiO_2$—$Al_2O_3$—CaO—$B_2O_3$ type glass and $Al_2O_3$, represented by C1. Moreover, the material for the after-lamination green sheet is a mixture of $SiO_2$—$Al_2O_3$—CaO—$B_2O_3$—$Li_2O$ type glass and $Al_2O_3$, represented by C1.

In Examples 1 to 3, the resistor (R1) and the capacitor (C1) on the ceramic core substrate (A1) were simultaneously fired or after-fired at a firing temperature of 900° C. Thereafter, the resistor (R1) and the capacitor (C1) were trimmed so that the resistance and the capacitance were adjusted. Then, the after-lamination green sheet (A3) was laminated to the ceramic core substrate (A1) to produce an after-lamination substrate. The after-lamination substrate was fired at a temperature (700° C.) slightly lower than the glass yield point (720° C.) of the glass component ($SiO_2$—$Al_2O_3$—CaO—$B_2O_3$ type glass) contained in the resistor (R1) and the dielectric (C1). This firing temperature (700° C.) is sufficiently higher than the glass yield point (620° C.) of the after-lamination green sheet (A3) so that the after-lamination substrate can be sufficiently fired.

After the after-lamination substrate was fired, the dispersion of the resistance of the contained resistor (R1) and that of the capacitance of the contained capacitor (C1) were measured. The resistance dispersion of the resistor (R1) was ±0.2% or ±0.3%. The capacitance dispersion of the capacitor (C1) was ±0.1% or ±0.2%. The resistance dispersion and the capacitance dispersion were determined for 20 samples and were three times of the respective standard deviations. In the below-described measurements also, these conditions were employed.

In Examples 4 and 5, the material for the ceramic core substrate was a mixture of $SiO_2$—$B_2O_3$ type glass and $Al_2O_3$, represented by A2. The material for the resistor was a mixture of $SiO_2$—$B_2O_3$ type glass and $RuO_2$, represented by R2. The material for the dielectric was a mixture of $SiO_2$—$B_2O_3$ type glass and $BaTiO_3$, represented by C2. The material for the after-lamination green sheet was a mixture of $SiO_2$—$Al_2O_3$—CaO—$B_2O_3$—$Li_2O$ type glass and $Al_2O_3$, represented by A3.

In Examples 4 and 5, the resistor (R2) and the capacitor (C2) on the ceramic core substrate (A2) were simultaneously fired or after-fired at a firing temperature of 900° C. Thereafter, the resistor (R2) and the capacitor (C2) were trimmed so that the resistance and the capacitance were adjusted. Thereafter, the after-lamination green sheet (A3) was laminated to the ceramic core substrate (A2) to produce an after-lamination substrate. The after-lamination substrate was fired at a temperature (700° C.) slightly lower than the glass yield point (730° C.) of the glass component ($SiO_2$—$B_2O_3$ type glass) contained in the resistor (R2) and the dielectric (C2).

Thereafter, the dispersion of the resistance of the contained resistor (R2) and that of the capacitance of the contained capacitor (C2) were measured. The resistance dispersion of the resistor (R2) was ±0.3%. The capacitance dispersion of the capacitor (C1) was ±0.2%.

In the above-described Examples 1 to 5, the resistance dispersions of the contained resistors were up to ±0.3%. The capacitance dispersions of the contained capacitors were up to ±0.2%. Thus, it has been recognized that a high-quality ceramic multilayer substrate containing a resistor and a capacitor of which the dispersions are small can be produced.

In Comparative Example 6, the same materials and processes as those in Example 1 were employed. The ceramic core substrate (A1) and the resistor (R1) were simultaneously fired at a firing temperature of 900° C. Then, the resistor (R1) was trimmed so that the resistance was adjusted. Thereafter, the after-lamination green sheet (A1), which was made from the same material as that of the ceramic core substrate, was laminated to the ceramic core substrate (A1) to produce an after-lamination substrate. The after-lamination substrate was fired at a temperature (900° C.), which is equal to the firing temperature of the ceramic core substrate (A1). The dispersion of the resistance of the contained resistor (R1) was measured. The resistance dispersion of the contained resistor (R1) was ±22%. It is believed this is because the firing temperature of the after-lamination substrate was higher than the glass yield point (720° C.) of the glass component contained in the resistor (R1), and thus, the resistor (R1) was softened and melted when the after-lamination substrate was fired, and the sintering state of the resistor (R1) was changed.

In Comparative Example 7, the same materials and processes as those in Example 2 were employed. The capacitor (C1) on the ceramic core substrate (A1) was after-fired. Thereafter, the capacitor (C1) was trimmed so that the capacitance was adjusted. Thereafter, the after-lamination green sheet (A1), which was made from the same material as that of the ceramic core substrate, was laminated to the ceramic core substrate (A1) to produce an after-lamination substrate. The after-lamination substrate was fired at a temperature (900° C.) equal to the firing temperature of the ceramic core substrate (A1). Thereafter, the dispersion of the capacitance of the capacitor (C1) was measured. The capacitance dispersion of the contained capacitor (C1) was ±25%. It is believed, this is because the firing temperature of the after-lamination substrate was higher than the glass yield point (720° C.) of the glass component in the contained capacitor (C1), and thus, the dielectric (C1) was softened and melted when the after-lamination substrate was fired, and the sintering state of the dielectric (C1) was changed.

In Examples 1 to 5, the firing temperatures of the after-lamination substrates were set at a lower temperature (700° C.) compared to the glass yield points of the glass components contained in the resistors and the dielectrics of the capacitors. Thus, the fired resistors and dielectrics could be securely prevented from being softened and melted, and the dispersions of the resistance and the capacitance, which would be caused by the firing of the after-lamination substrate, could be securely reduced.

In Examples 1 to 5, the glass components of the ceramic core substrates 11 were the same as those of the resistors and the dielectrics. However, the glass components of the ceramic core substrate 11, the resistors and the capacitors may be different from each other.

According to the structure shown in FIG. 1, when the after-lamination substrate is fired, the firing-shrinking of the after-lamination green sheet 21, laminated to the fired ceramic core substrate 11, is suppressed on the one side of the green sheet 21, due to the fired ceramic core substrate 11. If the firing shrinking force of the after-lamination green sheet 21 is rather small compared to the mechanical strength of the ceramic core substrate 11, no problems will occur. However, if the mechanical strength of the ceramic core substrate 11 is low, or the number of the after-lamination green sheets 21 laminated to the ceramic core substrate 11 is increased to have a large firing shrinking force, the ceramic core substrate 11 may be not durable to the firing shrinking force. As a result, the fired substrate will be distorted.

As a countermeasure against the above-described problem, the ceramic core substrate 11 has a multilayer structure in the embodiment of FIG. 1. Thus, the mechanical strength of the ceramic core substrate 11 can be enhanced so that the distortion of the fired substrate is eliminated, with the wiring-density of the ceramic core substrate 11 being enhanced and also, with the size being reduced.

To prevent the fired substrate from being distorted, a constraining firing method may be employed. According to the constraining firing method, a constraining green sheet (ceramic green sheet made of alumina or the like which can be sintered at a high temperature) is laminated to the after-lamination green sheet laminated as the outermost layer to the after-lamination substrate. In the subsequent firing process, the after-lamination substrate is constrainingly fired at the sintering temperature of the after-lamination green sheet 21 with the after-lamination substrate being pressed or not pressed via the constraining green sheet 21. Thus, the after-lamination substrate is integrated, and thereafter, the remaining constraining green sheet is removed. Accordingly, the firing shrinkage or distortion in the X and Y directions of the after-lamination green sheet 21 laminated to the fired ceramic core substrate can be suppressed substantially uniformly on both of the sides of the after-lamination green sheet 21. A high-quality ceramic multilayer substrate having no distortion can be produced.

In the above-described embodiments, the ceramic core substrate is made from a low-temperature firing ceramic which is fired at a temperature of about 800° C. to 1000° C. As seen in Example 1 and 5, the ceramic core substrate, the resistor, and the capacitor can be simultaneously fired. The number of firing processes can be reduced, so that the production efficiency is enhanced. Advantageously, as a wiring conductor which is fired simultaneously with the ceramic core substrate, metals with low melting points such as Ag type conductors having a low resistance and superior electrical characteristics can be employed. Needless to say, in the case in which the ceramic core substrate is made from a low temperature firing ceramic, the resistor, the dielectric of the capacitor, the electrodes may be printed on the fired ceramic core substrate and then fired as described in Examples 2, 3, and 4.

According to the structure of FIG. 1, the resistor 14 and the capacitor 18 are formed on the one side (the upper surface) of the ceramic core substrate 11. However, the resistors 14 and the capacitors 18 may be formed on both sides of the ceramic core substrate 11. Moreover, the after-lamination green sheets 21 may be laminated to both of the sides of the ceramic core substrate 11.

If the after-lamination green sheets 21 are laminated to both of the sides of the ceramic core substrate 11, firing shrinking forces are generated in the after-lamination green sheets 21 formed on both of the sides of the ceramic core substrate 11 when the laminated substrate is fired. This is effective to prevent the distortion of the fired substrate. In this case, the number of the after-lamination green sheets 21 laminated to both of the sides of the ceramic core substrate 11 may be different from each other. If the same numbers of the after-lamination green sheets 21 are laminated onto both of the sides of the ceramic core substrate 11, the firing shrinking forces acting on both of the sides of the ceramic core substrate 11, when the after-lamination substrate is fired, will be equal to each other. Thus, the distortion of the fired substrate can be prevented effectively and securely.

Moreover, the dielectric 15 of the contained capacitor 18 in the structure of FIG. 1 is formed by printing. However, a dielectric sheet, that is, a green sheet of a dielectric may be laminated onto the uppermost layer and/or the lowermost layer in production of the ceramic core substrate, and the laminate fired. In this case, the electrodes of the capacitor may be printed on the dielectric sheet and the ceramic green sheet to be laminated onto the dielectric sheet, respectively, before the lamination process. Also, in this case, the resistor on the ceramic core substrate may be simultaneously fired or after-fired, if necessary. Advantageously, the flatness of the surface of the substrate can be enhanced by formation of the ceramic core substrate having the capacitor using the dielectric sheet as described above, as compared to the formation of the dielectric by printing as seen in FIG. 1.

In addition, modifications and changes may be made. For instance the ceramic core substrate may be made from a high-temperature sintering ceramic such as alumina or the like, a piezoelectric ceramic, a magnetic ceramic, or the like. Moreover, the ceramic core substrate may be a single-layer substrate. The number of the after-lamination green sheets may be appropriately changed. The ceramic multilayer substrate may contain a resistor only or contain a capacitor only.

What is claimed is:

1. A method of producing a ceramic multilayer substrate containing at least one resistor or capacitor comprising:
    providing a fired ceramic core substrate having thereon at least one fired element comprising a ceramic and a glass, the element being selected from the group consisting of a resistor and a capacitor;
    trimming the fired element so that the resistance or the capacitance, or both, are adjusted;
    laminating an after-lamination sheet comprising at least one unfired ceramic green sheet capable of being sintered at a temperature lower than the sintering temperature of the ceramic of the fired element to produce an after-lamination substrate; and
    firing the after-lamination substrate at a temperature which is lower than the sintering temperature of the ceramic of the element.

2. A method of producing a ceramic multilayer substrate according to claim 1, wherein the firing of the after-lamination substrate is conducted at a temperature is lower than the glass yield point of the glass component contained in the fired element.

3. A method of producing a ceramic multilayer substrate according to claim 2, wherein the after-lamination sheet comprises a $SiO_2$—$Al_2O_3$—$CaO$—$B_2O_3$—$Li_2O$ glass.

4. A method of producing a ceramic multilayer substrate according to claim 3, wherein the ceramic core substrate comprises a low-temperature firing ceramic having a sintering temperature of about 800° C. to 1000° C.

5. A method of producing a ceramic multilayer substrate according to claim 4, wherein the ceramic core substrate comprises a multilayer structure.

6. A method of producing a ceramic multilayer substrate according to claim 5, wherein a constraining green sheet having a sintering temperature greater than that of the after-lamination sheet is laminated onto the after-lamination sheet as the outermost layer of the after-lamination substrate, and said firingis conducted at the sintering temperature thereof of the after-lamination substrate, so that the after-lamination substrate is integrated, and thereafter the remaining constraining-green sheet is removed.

7. A method of producing a ceramic multilayer substrate according to claim 1, further comprising forming the fired ceramic core substrate having said at least one element thereon.

8. A method of producing a ceramic multilayer substrate according to claim 7, comprising forming the fired ceramic core substrate and thereafter forming said at least one fired element thereon.

9. A method of producing a ceramic multilayer substrate according to claim 7, comprising combining an unfired ceramic core substrate and at least one unfired element and co-firing the combination.

10. A method of producing a ceramic multilayer substrate according to claim 1, wherein the unfired ceramic sheet comprises a $SiO_2$—$Al_2O_3$—$CaO$—$B_2O_3$—$Li_2O$ glass.

11. A method of producing a ceramic multilayer substrate according to claim 10, wherein the ceramic core substrate comprises a low-temperature firing ceramic having a sintering temperature of about 800° C. to 1000° C.

12. A method of producing a ceramic multilayer substrate according to claim 1, wherein the fired element ceramic is at least one of alumina, $RiO_2$ and barium titanate.

13. A method of producing a ceramic multilayer substrate according to claim 12, wherein the ceramic core substrate has a multilayer structure.

14. A method of producing a ceramic multilayer substrate according to claim 13, wherein a constraining green sheet having a sintering temperature greater than that of the after-lamination sheet is laminated onto the after-lamination sheet as the outermost layer of the after-lamination substrate, and said firingis conducted at the sintering temperature thereof of the after-lamination substrate, so that the after-lamination substrate is integrated, and thereafter the remaining constraining-green sheet is removed.

15. A method of producing a ceramic multilayer substrate according to claim 1, wherein the ceramic core substrate comprises a low-temperature firing ceramic having a sintering temperature of about 800° C. to 1000° C.

16. A method of producing a ceramic multilayer substrate according to claim 15, wherein the ceramic core substrate has a multilayer structure.

17. A method of producing a ceramic multilayer substrate according to claim 16, wherein a constraining green sheet having a sintering temperature greater than that of the after-lamination sheet is laminated onto the after-lamination sheet as the outermost layer of the after-lamination substrate, and said firingis conducted at the sintering temperature thereof of the after-lamination substrate, so that the after-lamination substrate is integrated, and thereafter the remaining constraining-green sheet is removed.

18. A method of producing a ceramic multilayer substrate according to claim 1, wherein the ceramic core substrate has a multilayer structure.

19. A method of producing a ceramic multilayer substrate according to claim 18, wherein a constraining green sheet having a sintering temperature greater than that of the after-lamination sheet is laminated onto the after-lamination sheet as the outermost layer of the after-lamination substrate, and said firingis conducted at the sintering temperature thereof of the after-lamination substrate, so that the after-lamination substrate is integrated, and thereafter the remaining constraining-green sheet is removed.

20. A method of producing a ceramic multilayer substrate according to claim 1, wherein a constraining green sheet having a sintering temperature greater than that of the after-lamination sheet is laminated onto the after-lamination sheet as the outermost layer of the after-lamination substrate, and said firingis conducted at the sintering temperature thereof of the after-lamination substrate, so that the after-lamination substrate is integrated, and thereafter the remaining constraining-green sheet is removed.

* * * * *